United States Patent [19]
Hirai et al.

[11] Patent Number: 5,394,474
[45] Date of Patent: Feb. 28, 1995

[54] ECHO ATTACHING CIRCUIT AND AUDIO DEVICE USING THE SAME

[75] Inventors: Jun Hirai; Kaoru Izawa, both of Kyoto, Japan

[73] Assignee: Rohm Co., Ltd., Kyoto, Japan

[21] Appl. No.: 165,410

[22] Filed: Dec. 13, 1993

[30] Foreign Application Priority Data

Dec. 15, 1992 [JP] Japan .................................. 4-354326

[51] Int. Cl.$^6$ ............................................. H03G 3/00
[52] U.S. Cl. ...................................... 381/63; 381/106
[58] Field of Search ......................... 381/63, 86, 106; 333/14

[56] References Cited

U.S. PATENT DOCUMENTS 4,184,047  1/1980  Langford .................. 381/63

OTHER PUBLICATIONS

Ser. No. 08/008,712 filed Jan. 25, 1993 K. Izawa et al.–application.

Primary Examiner—Forester W. Isen
Attorney, Agent, or Firm—Fay, Sharpe, Beall, Fagan, Minnich & McKee

[57] ABSTRACT

This invention includes a compression circuit for compress one of an audio signal and a mixture of the audio signal and an echo signal, a delay circuit for delaying an output signal of the compression circuit by a predetermined time and an expansion circuit having a conversion rate controlled by a DC voltage generated correspondingly to a regulation of the volume controller, for expanding the output signal of the delay circuit according to a reverse conversion function to the compression conversion function to generate the echo signal.

9 Claims, 4 Drawing Sheets

ECHO ATTACHING CIRCUIT AND AUDIO DEVICE USING THE SAME

BACKGROUND OF THE INVENTION

1. Technical Field

The present invention relates to an echo attaching circuit and an audio device using the same and, particularly, to an improvement of a circuit for producing an echo signal from an audio signal and attaching the echo signal to the audio signal, that is, an echo attaching circuit to be used in an audio device such as Karaoke device, component stereo device, radio cassette device or VTR, etc.

2. Background Art

Almost all of the recent audio devices are equipped with the so-called Karaoke function with which an audio input from a microphone can be mixed or synthesized with other reproduced signal, etc., and output externally. For such function, an echo attaching function for attaching an echo effect is indispensable for which the echo signal must be internally produced. Echo signal is usually produced by delaying an audio signal which is obtained by converting an audio information such as voice and/or music into an electric signal by a certain constant time. In order to enhance the echo effect, the echo attaching circuit operates to attenuate the audio signal and the echo signal and feeds back them to the side of the audio signal to produce a signal which is a mixture of the audio signal and the fed back signal, and the delaying and mixing operations are repeated for thus produced signal.

FIG. 5 shows an example of a construction of a conventional echo attaching circuit. In FIG. 5, an echo attaching circuit 8 includes a waveform synthesizing circuit 1, a low-pass filter (LPF) 2, a delay circuit 3 using a BBD (Bucket Brigade Device), a low-pass filter 4, attenuators (ATTs) 5 and 6 and a waveform synthesizer 7.

An audio signal A input to the echo attaching circuit 8 is synthesized or combined in the waveform synthesizer 7 with a signal which is obtained by attenuating an echo signal B down to a suitable level by the attenuator 6, resulting in an audio signal C to which the echo is attached. The audio signal C is amplified and output from a loudspeaker as sound or recorded on such as tape by means of a recording circuit.

The echo signal B is produced by a feedback loop including the attenuator. That is, the echo signal B output is attenuated by the attenuator 5 down to a suitable level and fed back to an input side in which it is mixed with the audio signal A by the waveform synthesizer 1. Then, the synthesized signal is passed through the low-pass filter 2, resulting in a signal D. A delay signal E is produced by delaying the signal D by a constant time by the delay circuit (BBD) 3 and the echo signal B is produced by passing the signal E through the low-pass filter 4. The low-pass filters 2 and 4 are provided in an upstream and a down stream of the BBD 3 to prevent an aliasing distortion by allowing components whose frequencies are lower than a half of a sampling frequency of the BBD 3 to pass through. By removing noise component of the delay signal E by means of the low-pass filter 4, the delay. signal E becomes the echo signal B. The audio signal becomes the echo signal by further attenuating the echo signal E thus produced by delay and this is circulated while being attenuated and the echo effect is obtained by repeating this procedure.

The BBD 3 having construction for delaying an analog signal itself is noise-sensitive and easily degraded with time. Therefore, its accuracy and reliability are insufficient. On the other hand, demand of improvement of function of the audio device by users or customers is becoming severe more and more, and, for example, a dynamic range of about 90 dB is required for an audio signal with echo signal in Karaoke function.

In order to satisfy such demand, there was provided a digital memory delay circuit composed of an A/D converter, a controller, a memory and a D/A converter, etc. The digital memory delay circuit operates to delay an audio signal by storing it in the memory thereof as a digital data and reading it after a constant time lapses. In such delay circuit, however, the number of conversion bits of the A/D converter as well as the D/A converter becomes large. Application Ser. No. 8,008,712 assigned to the assignee of this application discloses an invention related to a delay circuit in which an audio signal is delayed by an A/D converter and a memory, with smaller number of bits. FIG. 4 shows a construction of the delay circuit disclosed in application Ser. No. 8,008,712, schematically.

In FIG. 4, a reference numeral 10a depicts a circuit board of an echo attaching circuit to be mounted on the side of a main body on which a main circuit of an audio device is mounted. On the circuit board 10a, a compression circuit 11 for logarithmic compression transformation of an analog input voltage signal, a digital memory type delay circuit 12 which delays an audio signal by converting it into a digital signal and storing it in a memory as mentioned previously and an expansion circuit 13 for exponential transformation (as an inverse transformation with respect to logarithmic transformation) are provided. A reference numeral 20a depicts a circuit board of the echo attaching circuit to be mounted on a front panel of the audio device, that is, the so-called operation panel. On the circuit board 20a, a volume controller 21a for echo regulation which serves as an attenuator for setting a feedback rate of a loop and which may comprise a variable resistor and a volume controller 21b for reverberation regulation which serves as an attenuator for setting reverberation effect and which may comprise a variable resistor are mounted.

FIG. 5 shows a modification of the echo attaching circuit shown in FIG. 4, in which the feedback rate of the loop and the reverberation effect are simultaneously set by a single volume controller 21. The modification is not disclosed in the previously mentioned U.S. Application.

An original signal A input to the echo attaching circuit 10a (10) is synthesized with a signal B' which is obtained by attenuating an echo signal B to a suitable level by the volume controller 21b (21) and output as an audio signal C having echo attached.

The echo signal B is produced by a feedback loop including the volume controller 21a (21). That is, the echo signal B output is attenuated to a suitable level by the volume controller 21a (21), returned to an input side as a feedback signal B" and synthesized with the original signal A, resulting in a signal waveform including the echo signal synthesized with the original signal A. The resultant signal is compressed once by the compression circuit 11 and then delayed by a constant time by the delay circuit 12, resulting in a delay signal D. The delay signal D is expanded by the expansion circuit 13, resulting in the echo signal B which is synthesized again with the original signal.

By attenuating the echo signal B produced by delay and feeding back it, the reverberation effect is produced. By adding this to the original signal at a certain ratio, the audio signal C having echo attached thereto whose amounts of reverberation and echo are variable is obtained.

In an audio device having the echo attaching circuit mentioned in application Ser. No. 8,008,712 or other conventional echo attaching circuit, a user can regulate amounts of echo and reverberation by means of a volume controller composed of a variable resistor and provided on a front panel thereof.

Consequently, the echo signal B produced in the circuit on the circuit board reciprocates between the circuit board on the main body of the audio device and the control board provided on the front panel repeatingly until it becomes the signal B' through attenuation by means of the volume controller 21. Thus, the echo signal produced as an analog signal becomes easily influenced by noise, compared with the original signal.

SUMMARY OF THE INVENTION

An object of the present invention is to provide an echo attaching circuit which is capable of generating an echo signal which is hardly influenced by noise, while restricting a circuit size of an echo signal generator portion thereof.

Another object of the present invention is to provide an audio device which is capable of generating clearer echo, while restricting a circuit size of an echo attaching circuit.

In order to achieve the above mentioned objects, the echo attaching circuit according to the present invention comprises a compression circuit for compressing one of an audio signal and a signal containing the audio signal and an echo signal, a delay circuit for delaying an output signal of the compression circuit by a predetermined time and an expansion circuit having a transformation rate controlled by a DC voltage generated according to a setting of a volume controller, for expanding an output signal of the delay circuit to produce the echo signal.

In order to deal with noise problem in the conventional volume control mentioned previously, an electronic volume controller (an electronic attenuator circuit) may be employed. FIG. 3 shows a circuit in which an electronic volume controller 220 is employed instead of the volume controller 21 in the circuit shown in FIG. 5. In FIG. 3, a manual volume controller 210 (variable resistor) is provided on a circuit board 200 of a front panel 20. The manual volume controller 210 serves to produce a DC voltage which is relatively insensitive to noise as a voltage control signal. A controller circuit 200 provided in a wiring line for an echo signal B is provided on a circuit board 100 of an audio device receives the voltage control signal. Thus, it is possible to manually regulate an echo signal level with the DC control signal voltage. As a result, there is no need of providing a long signal line for the echo signal and so it is possible to make the echo signal relatively insensitive to noise.

The controller circuit 220 as an electronic volume controller is composed mainly of a current regulator circuit 222 including a voltage controlled amplifier whose operating current is regulated according to the voltage control signal. The controller circuit 220 further includes a voltage-to-current converter circuit 221 connected to an output of the current regulator circuit 222 and a current-to-voltage converter circuit 223 connected to an output of the current regulator circuit 222. Therefore, a circuit size of an echo signal generator portion becomes large, which may adversely affect integrity of other circuit portions of the audio device which includes a number of IC chips each including various circuits. Thus, a new problem may occur.

According to the present invention, however, this problem is solved and an echo signal becomes insensitive to noise without substantial increase of circuit size.

That is, in the echo attaching circuit and an audio device employing the same, according to the present invention, transformation rate of expansion in the expansion circuit can be controlled according to a value of the DC voltage generated by the volume controller. This means that the expansion circuit itself additionally has an electronic volume control function using the voltage signal as a control signal.

As a result, it becomes unnecessary to extend the signal line for echo signal to the side of the operation panel and to provide a specific electronic volume control circuit. Therefore, increase of circuit size is restricted and echo signal which is relatively insensitive to noise can be generated.

DESCRIPTION OF THE PREFERRED EMBODIMENTS

Figure 1A:
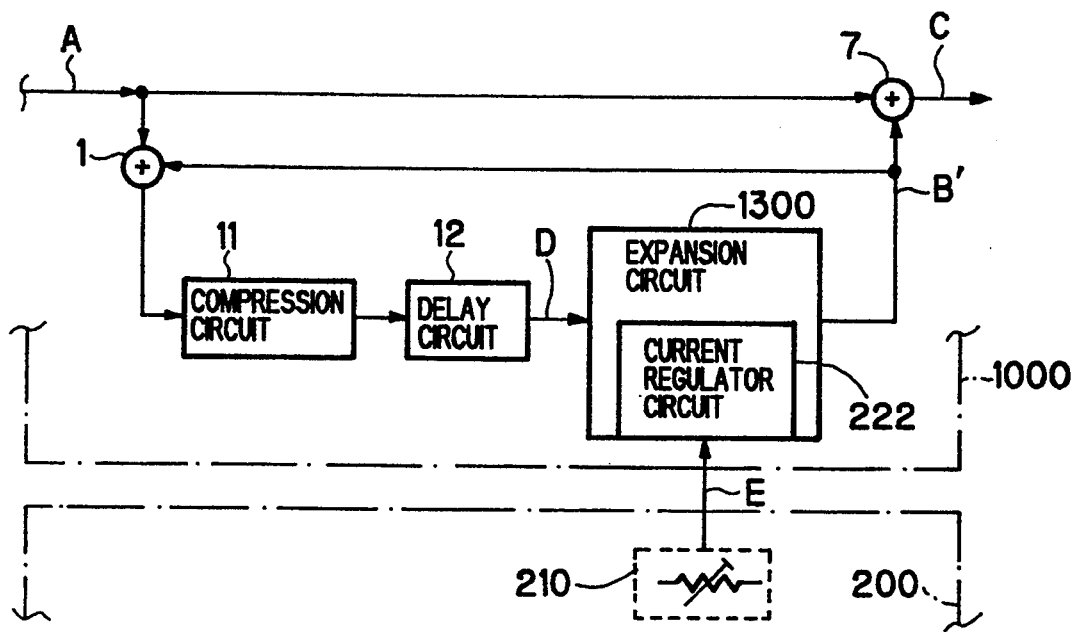
FIG. 1(a) is a block circuit diagram of an embodiment of an echo attaching circuit according to the present invention.
Figure 1B:
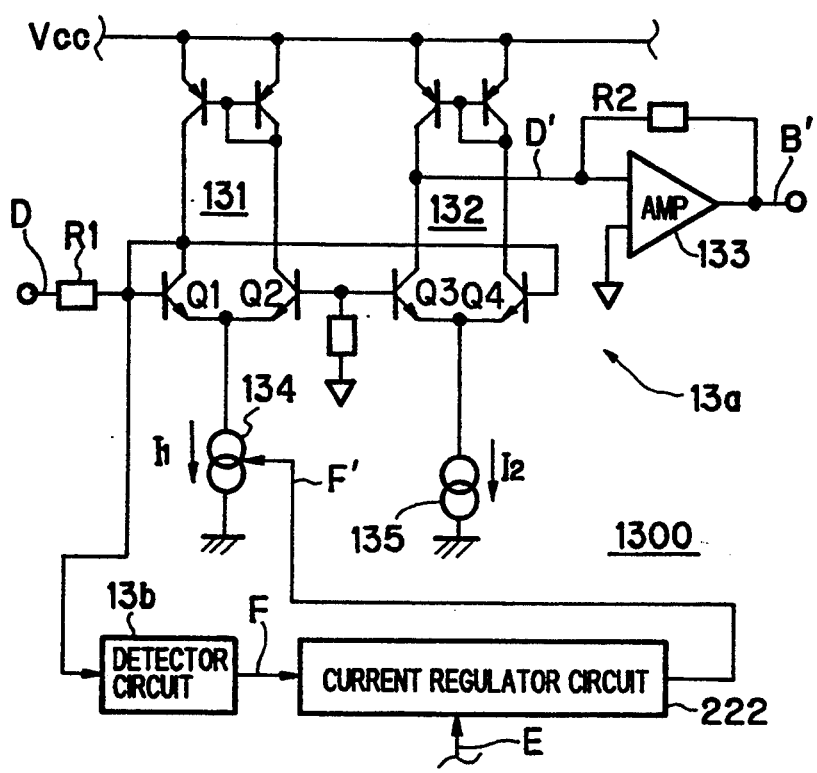
FIG. 1(b) is a circuit diagram of an example of an expansion circuit in FIG. 1(a)
Figure 2:
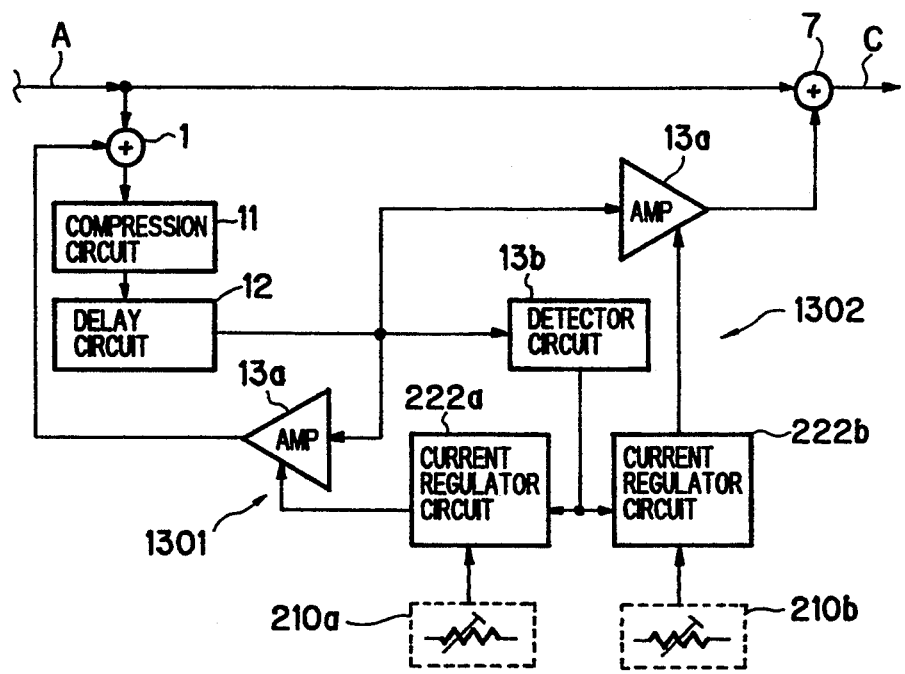
FIG. 2 is a circuit diagram of another example of the expansion circuit in FIG. 1(a)
Figure 3:
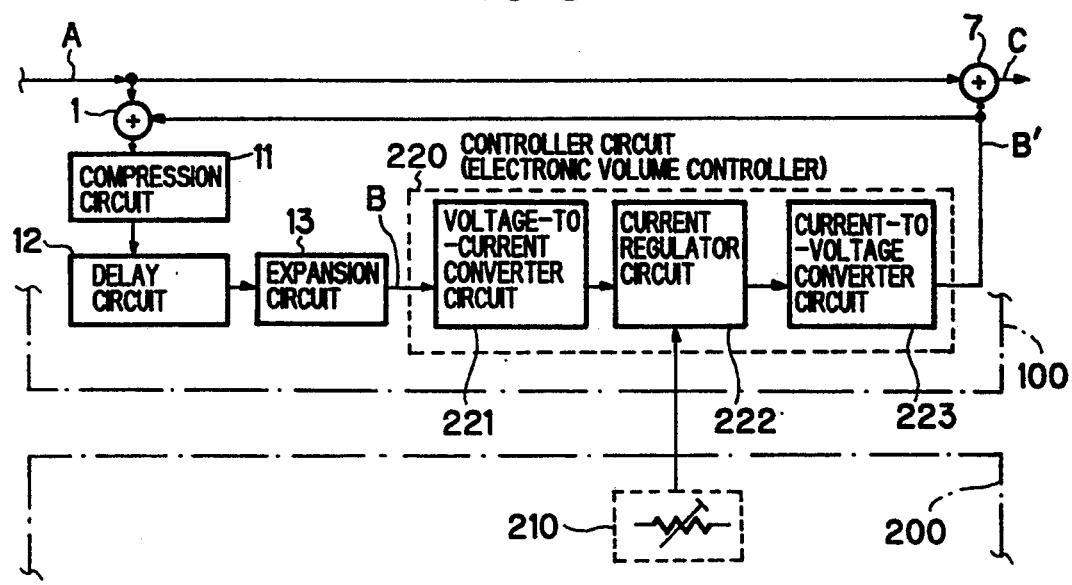
FIG. 3 is a block circuit diagram of a circuit which employs an electronic volume controller shown in FIG. 5.

FIGS. 1 and 2 show an improvement of the echo attaching circuit shown in application Ser. No. 8,008,712, in which an electronic volume control is realized by providing a current regulator circuit in an expansion circuit. For simplicity of description, an electronic volume control which has functions of echo regulating volume controller (attenuator) and reverberation regulating volume controller (attenuator) will be described first.

In FIG. 1(a), a compression circuit 11, a delay circuit 12 and an expansion circuit 1300 having volume control function are provided on a circuit board 1000 of an echo attaching circuit, which is to be mounted on the side of an audio device.

The expansion circuit 1300 controls a current value of a signal to be expanded thereby, according to an external DC voltage. In order to realize this, a voltage controlled current regulator circuit 222 is provided. Further, in order to generate the external voltage, a volume controller 210 which may be a manual variable resistor is provided on a circuit board 200 of the echo attaching circuit, which is to be mounted on a front panel of the audio device. The volume controller 210 comprises a volume controller for setting a feedback rate of a loop and a reverberation amount, simultaneously.

The delay circuit 12 is constituted as shown in application Ser. No. 8,008,712, with an A/D converter circuit for converting an analog output of the compression circuit 11 into a digital data, a controller for storing an output of the A/D converter in a memory and reading it after a certain time lapses and a D/A converter for converting the digital data read out from the memory into an analog signal. The compression circuit 11 serves to compress the input analog signal according to a compression function whose compression rate for large amplitude range is larger than that for small amplitude range, that is, for example, a logarithmic function which increases monotonously while being convex upwardly. The expansion circuit 13 expands the input analog signal according to the reverse function of the compression function or an exponential function.

Figure 4:
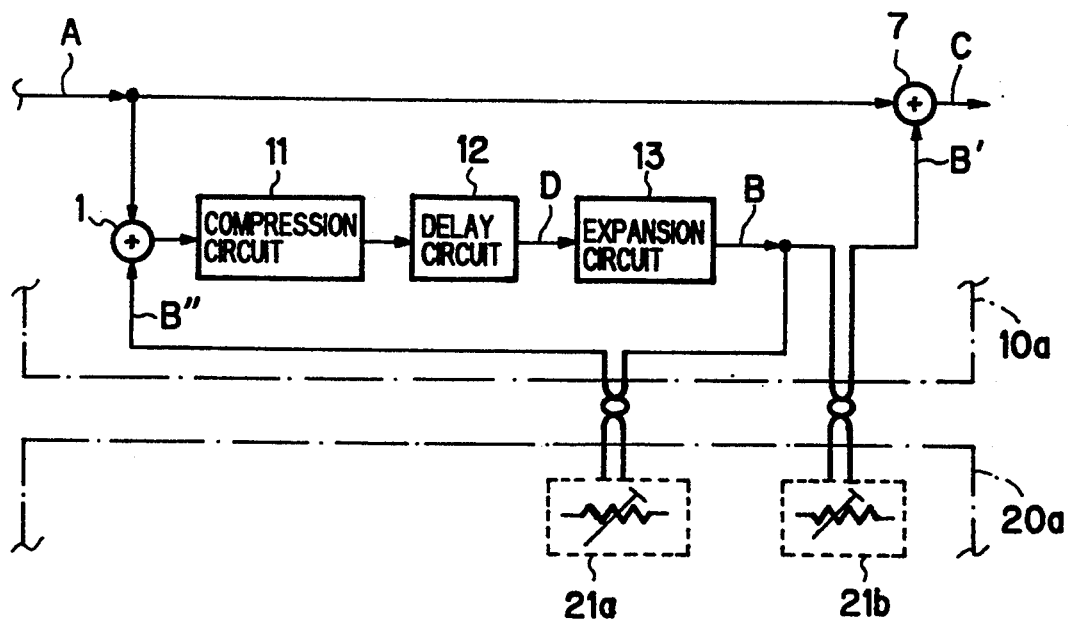
FIG. 4 is a block circuit diagram showing a construction disclosed in application Ser. No. 8,008,712, schematically.
Figure 5:
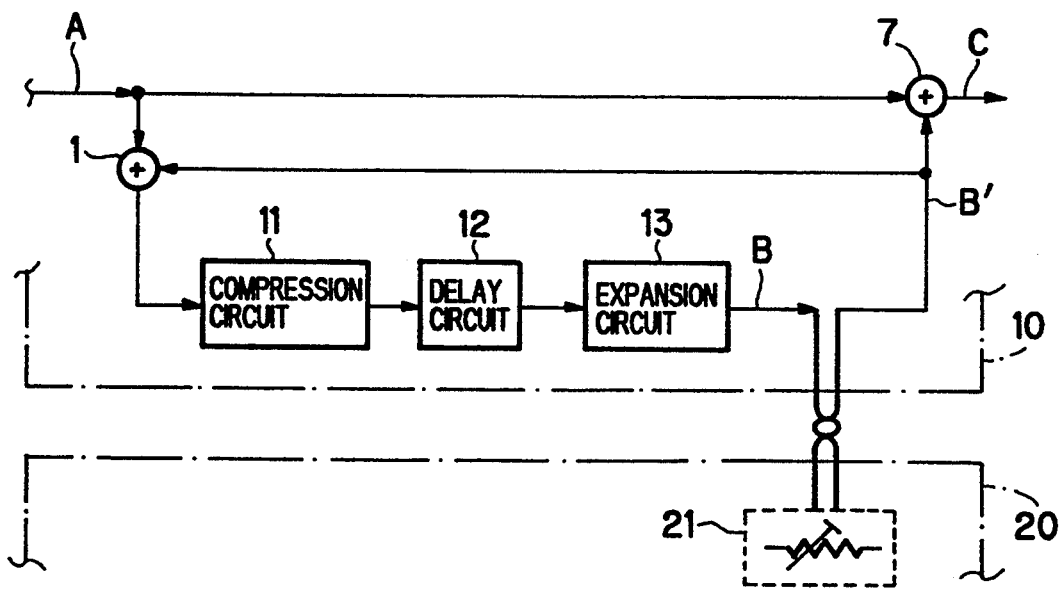
FIG. 5 is a block circuit diagram of the conventional construction shown in FIG. 4, in which a single volume controller is used for echo regulation as well as reverberation regulation.
Figure 6:
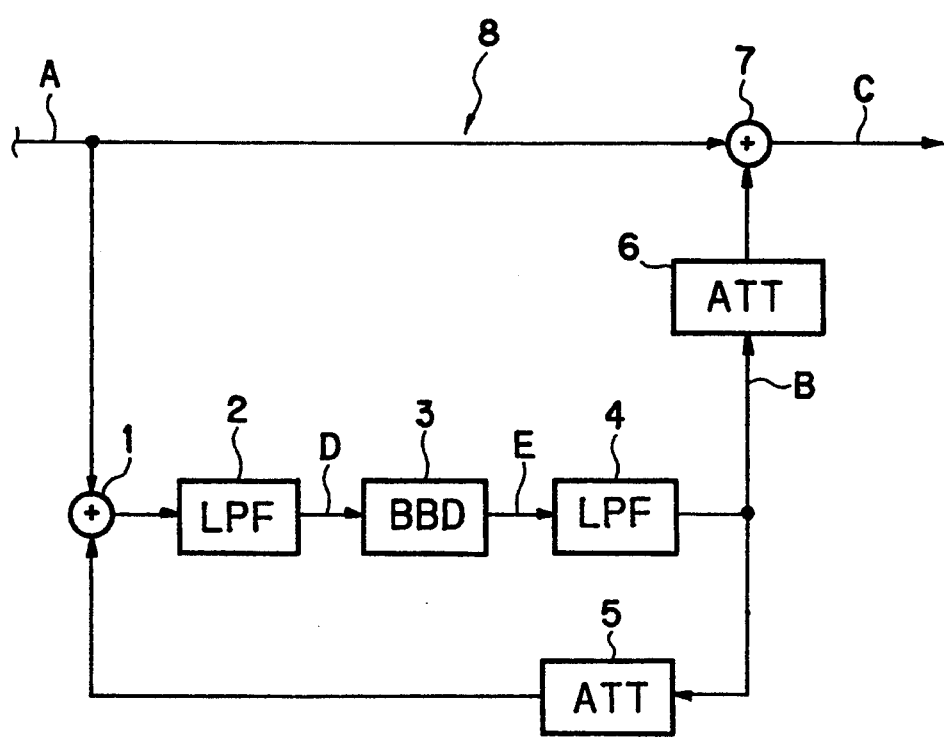
FIG. 6 is a block circuit diagram of a conventional echo attaching circuit using a BBD (Bucket Bridgade Device).

Since the operation of the whole echo attaching circuit has been described with reference to FIGS. 4 to 6 and since it is disclosed in detail in application Ser. No. 8,008,712, the expansion circuit 1300 having the electronic volume control function will be described in detail mainly.

As shown in FIG. 1(b), the expansion circuit 1300 comprises an amplifier 13a, a detector circuit 13b and the current regulator circuit 222. The amplifier 13a includes differential amplifiers 131 and 132 and an output amplifier 133. An input transistor of the differential amplifier 131 is diode-connected to convert an input signal exponentially by a diode characteristics of the transistor, the differential amplifier 132 amplifies it in current and the output amplifier 133 converts it into a voltage signal.

The expansion of the input signal by the exponential conversion is performed by changing amplification of the differential amplifier 131 correspondingly to amplitude of the input signal. That is, Current of a current control circuit (variable current source) of the differential amplifier 13a is controlled correspondingly to the amplitude of input signal by detecting the input signal by the detector circuit 13b to generate a detection signal corresponding to the input signal amplitude and controlling a value of current of the variable current source 134 according to the detection signal.

In detail, the input differential amplifier 131 of the amplifier 13a is connected between a power supply line Vcc and a ground line GND and includes a transistor load composed of a pair of transistors forming a current mirror circuit, a pair of differential transistors Q1 and Q2 having collectors to which a same current is supplied through the transistor load and the variable current source 134 provided in a downstream of the differential transistor pair for controlling their operating current I1, in the order. The transistor Q1 has a base to which a delayed echo signal D is supplied through a resistor R1 and the transistor Q2 has a base supplied with a predetermined reference voltage. The base and collector of the transistor Q1 are connected together to provide the diode characteristics by which the exponential characteristics is obtained.

The second differential amplifier 132 of the amplifier 13a is similarly connected between a power supply line Vcc and a ground line GND and includes a transistor load composed of a pair of transistors forming a current mirror circuit, a pair of differential transistors Q3 and Q4 having collectors to which a same current is supplied through the transistor load and the variable current source 135 provided in a downstream of the differential transistor pair for controlling their operating current I2, in the order. The transistor Q4 has a base connected to the collector of the transistor Q1 of the input differential amplifier 131 and the transistor Q3 has a base supplied with the reference voltage.

The output amplifier 133 of the amplifier 13a is supplied with a current signal D' which is an output of the differential amplifier 132 as an input signal, amplifies and converts it to obtain an output voltage signal which is output as an echo signal B'.

The detector circuit 13b detects an amplitude level of the input signal D and produces a detection signal F which is a current signal.

The current regulator circuit 222 produces a current signal F' for current-control of the variable current source 134 from the detection signal F by amplifying a current of the detection signal F with an amplification factor corresponding to the voltage control signal E which is the DC voltage set by the volume controller 210. The current signal F' is supplied to the variable current source 134 of the differential amplifier 131 as a control signal for controlling current value of the variable current source 134. Therefore, the operating current I1 is controlled correspondingly to the level of the input signal D.

Describing an operation of the expansion circuit 1300, the delayed echo signal D (voltage signal) which is the input signal is converted into a current signal through the resistor R1 corresponding to which there are potential differences generated between the bases and emitters of the transistors Q1 and Q2 of the differential amplifier 131, respectively. Thereafter, these voltage differences are converted into current difference in the differential amplifier 132, resulting in the current signal D'. The current signal D' is converted into a voltage signal, that is, the echo signal B' through the resistor R2 of the output amplifier 133.

The amplification factor of the amplifier 13a from the input signal D to the output signal B' is usually determined by a ratio of the resistor R2 to the resistor R1 and a ratio of the current I2 to I1. Further, the current I1 is also determined by the DC voltage control signal E generated by the manual volume controller 210.

That is, the amplifier 13a converts exponentially the input voltage signal with conversion rate corresponding to the control current flowing through the variable current source 134 and outputs it. The detection circuit 13b generates a current signal corresponding to the amplitude of the input voltage signal. The current regulator circuit 222 is a current-to-current converter circuit and is constituted with, for example, a variable gain current amplifier circuit whose current amplification factor is set by a voltage value. This circuit amplifies or attenuates the detection signal from the detector circuit 13b at amplification factor determined by a voltage set by the variable resistor 210 (volume controller 210) and controls the current of the variable current source 134 by applying the output signal to a control terminal of the variable current source 134.

Particularly, in order to give the electronic volume control function to the expansion circuit 1300, the current of the variable current source 134 is controlled by generating the detection signal (in this example, current signal) with power determined by the voltage of the volume controller 210. With this scheme, it becomes possible to control amounts of echo and reverberation without providing a specific electronic volume controller circuit and thus the increase of circuit size can be small.

FIG. 2 shows an example of an expansion circuit in which a volume controller 210a for echo regulation, that is, for setting feedback rate of the loop, and a volume controller 21b for reverberation regulation can be set independently from each other.

That is, instead of the expansion circuit 1300 shown in FIG. 1(b), the expansion circuit in FIG. 2 includes an expansion circuit 1301 for echo regulation and an expansion circuit 1302 for reverberation regulation, in which an output of an amplifier 13a of the expansion circuit 1301 is supplied to a waveform synthesizer circuit 7 to add it to an original signal A and an output of an amplifier 13a of the expansion circuit 1302 is supplied to a waveform synthesizer circuit 1 to circulate it as an echo signal. In this example, a detector circuit 13b is used commonly by the expansion circuits 1301 and 1302.

The volume controller 210a is for echo regulation and the volume controller 210b is for reverberation regulation. These volume controllers correspond to the volume controller 210 in FIG. 1 and current regulation circuits 222a and 222b correspond to the current regulation circuit 222 in FIG. 1.

As mentioned hereinbefore, in the described embodiments, the operating current of the amplifier which functions to exponentially converting an input signal correspondingly to the input signal is controlled to expand the input signal. The exponential conversion to be performed by the expansion circuit is a reverse conversion to the compression function of the compression circuit. Therefore, the construction of the expansion circuit can be any so long as it performs the reverse function. Further, the volume controller may be any so long as it can control the operating current of the expansion circuit by means of a DC voltage.

What is claimed is:

1. An echo attaching circuit for producing an echo signal by delaying an audio signal and outputting the audio signal together with the echo signal by attaching the echo signal to the audio signal by use of a volume controller, comprising:
a compression circuit for compressing one of the audio signal and a mixture signal including the audio signal and the echo signal according to a compression conversion function;
a delay circuit for delaying an output signal of said compression circuit;
an expansion circuit for expanding an output signal of said delay circuit according a reverse conversion function to the compression conversion function to form the echo signal, said expansion circuit having conversion rate of expansion conversion controlled by an externally supplied DC voltage; and
said volume controller adapted to generate the DC voltage having a value set by a manual regulation.

2. The echo attaching circuit claimed in claim 1, wherein said volume controller comprises a variable resistor provided on a operation panel of an audio device mounting said echo attaching circuit.

3. The echo attaching circuit claimed in claim 2, further comprising:
a control signal generator circuit responsive to the input signal for generating a first control signal corresponding to an amplitude of the input signal; and
a signal conversion circuit responsive to the DC voltage and the first control signal for converting the first control signal with a rate corresponding to the DC voltage into a second control signal, and wherein said expansion circuit comprises an amplifier circuit for expanding the input signal according to the second control signal to generate the output signal.

4. The echo attaching circuit claimed in claim 3, wherein the first and second control signals are current signals and said signal conversion circuit comprises a voltage controlled current-to-current conversion circuit and said amplifier circuit has an amplification factor controlled correspondingly to the second current signal.

5. The echo attaching circuit claimed in claim 4, wherein said compression circuit converts the one signal according to a logarithmic function, said control signal generator circuit comprises a detection circuit having an input supplied with the input signal and said amplifier circuit comprises a first and second differential amplifier circuits connected in series in the order for amplifying current of the input signal by exponentially amplifying the input signal and an amplifier circuit for converting a current output of said second differential amplifier into a voltage, a current value of a current source of said first differential amplifier circuit being controlled by the second control signal.

6. The echo attaching circuit claimed in claim 5, wherein said first differential amplifier circuit includes a pair of transistors, a base supplied with the input signal and a collector of one of said transistors being diode-connected so that the expansion conversion according to the exponential function is performed by a diode characteristics of the diode connection.

7. An echo attaching circuit for producing an echo signal by delaying an audio signal, regulating the echo signal by use of a first volume controller, attaching the regulated echo signal to the audio signal, regulating the echo signal by use of a second volume controller, and feeding it back to a circuit portion before delay to generate the audio signal attached with the echo signal, said audio attaching circuit, comprising:
a compression circuit for compressing one of the audio signal and a mixture signal including the audio signal and the echo signal according to a compression conversion function;
a delay circuit for delaying an output signal of said compression circuit;
a first expansion circuit for expanding an output signal of said delay circuit according to a reverse conversion function to the compression conversion function to form the echo signal to be attached, said first expansion circuit having conversion rate of expansion conversion controlled by an externally supplied first DC voltage as the first volume; and
a second expansion circuit for expanding an output signal of said delay circuit according to a reverse conversion function to the compression conversion function to form the echo signal to be fedback, said second expansion circuit having conversion rate of expansion conversion controlled by an externally supplied second DC voltage as the second volume, said first volume controller adapted to generate the first DC voltage having a value set by a manual regulation and said second volume controller adapted to generate the second DC voltage having a value set by a manual regulation.

8. An audio device for generating an audio signal attached with an echo signal by generating the echo signal by delaying the audio signal and regulating the echo signal through a volume controller, comprising:

an operation panel including said volume controller, said volume controller being adapted to generate a DC voltage having a value corresponding to a manual regulation; and an echo attaching circuit comprising a compression circuit for compressing one of the audio signal and a mixture signal including the audio signal and the echo signal according to a compression conversion function, a delay circuit for delaying an output signal of said compression circuit and an expansion circuit for expanding an output signal of said delay circuit according to a reverse conversion function to the compression conversion function to form the echo signal, said expansion circuit having conversion rate of expansion conversion controlled by the DC voltage.

9. An audio device for generating an audio signal attached with an echo signal by generating the echo signal by delaying the audio signal, attaching the echo signal to the audio signal by regulating the echo signal through a first volume controller, regulating the echo signal through a second volume controller and feeding back it to a circuit portion before delay, comprising:

an operation panel including said first and second volume controllers, said first volume controller being adapted to generate a first DC voltage having a value corresponding to a manual regulation, said second volume controller being adapted to generate a second DC voltage having a value corresponding to a manual regulation; and an echo attaching circuit comprising a first expansion circuit having an expansion conversion rate controlled by the externally supplied first DC voltage as the first volume, for expanding an output of a delay circuit according to a reverse conversion function to a compression conversion function to generate the echo signal to be attached and a second expansion circuit having an expansion conversion rate controlled by the externally supplied second DC voltage as the second volume, for expanding the output of said delay circuit according to a reverse conversion function to the compression conversion function to generate the echo signal to be fed back.

* * * * *